United States Patent
Wu et al.

(10) Patent No.: US 9,083,340 B1
(45) Date of Patent: Jul. 14, 2015

(54) MEMORY MATRIX

(71) Applicant: Xilinx, Inc., San Jose, CA (US)

(72) Inventors: Ephrem C. Wu, San Mateo, CA (US); Hongbin Ji, San Jose, CA (US); Rafael C. Camarota, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/278,244

(22) Filed: May 15, 2014

(51) Int. Cl.
*G06F 7/38* (2006.01)
*H03K 19/173* (2006.01)
*H03K 19/177* (2006.01)

(52) U.S. Cl.
CPC ................................ *H03K 19/1776* (2013.01)

(58) Field of Classification Search
None
See application file for complete search history.

(56) References Cited

U.S. PATENT DOCUMENTS

| | | | |
|---|---|---|---|
| 4,684,267 A * | 8/1987 | Fetouh | 384/294 |
| 7,000,165 B1 * | 2/2006 | Asson et al. | 714/733 |
| 2013/0315004 A1 * | 11/2013 | Chu et al. | 365/189.02 |

OTHER PUBLICATIONS

Xilinx, Inc., *7 Series FPGAs Memory Resources User Guide*, UG473(v1.2), Apr. 14, 2011, pp. 1-82, Apr. 14, 2011, particularly pp. 19, 34, and 35, Xilinx, Inc., San Jose, California, USA.

* cited by examiner

*Primary Examiner* — Anh Tran
(74) *Attorney, Agent, or Firm* — Gerald Chan

(57) ABSTRACT

An integrated circuit comprises a memory matrix including: a first memory cell array; a first multiplexer (MUX) coupled to an input of the first memory cell array; a second MUX coupled to an output of the first memory cell array; a second memory cell array; a third MUX coupled to an input of the second memory cell array; and a fourth MUX coupled to an output of the second memory cell array. The second MUX is coupled to the fourth MUX. The fourth MUX is configured to pass a selected one of: (1) an output from the third MUX, (2) an output from the second memory cell array, or (3) an output from the second MUX.

20 Claims, 14 Drawing Sheets

204

MEMORY MATRIX

TECHNICAL FIELD

The subject disclosure relates to memory cells in integrated circuits (ICs).

BACKGROUND

In many integrated circuit designs, it is desirable to have as much available memory as possible. Currently, a programmable IC such as a field programmable field array (FPGA), for example, may have about 50 megabits of memory. However, as technology advances this amount of memory may not be sufficient, creating a gap between the amount of memory that an IC can provide and the amount of memory that may be required by certain applications. For example, a network may have a line rate of up to 400 gigabits per second. Thus, a single millisecond of network traffic contains 400 megabits of data.

In some cases, the amount of memory may be increased by increasing the number of memory cells on the IC. However, more memory cells occupy more area, and area is limited in many IC designs. Therefore, it is desirable to provide other techniques of maximizing available memory in an IC.

SUMMARY

A first exemplary integrated circuit comprises a memory matrix including: a first memory cell array; a first multiplexer (MUX) coupled to an input of the first memory cell array; a second MUX coupled to an output of the first memory cell array; a second memory cell array; a third MUX coupled to an input of the second memory cell array; and a fourth MUX coupled to an output of the second memory cell array. The second MUX is coupled to the fourth MUX. The fourth MUX configured to pass a selected one of (1) an output from the third MUX, (2) an output from the second memory cell array, or (3) an output from the second MUX.

A second exemplary integrated circuit comprises a memory matrix including: a first memory cell array; a first MUX coupled to an input of the first memory cell array; a second MUX coupled to an output of the first memory cell array; a second memory cell array; a third MUX coupled to an input of the second memory cell array; and a fourth MUX coupled to an output of the second memory cell array. The first MUX is coupled to provide output to the third MUX; and the second MUX is coupled to provide output to the fourth MUX.

Other aspects and features will be evident from reading the following detailed description.

BRIEF DESCRIPTION OF THE DRAWINGS

The drawings illustrate the design and utility of exemplary circuits, in which similar elements are referred to by common reference numerals. These drawings are not necessarily drawn to scale. In order to better appreciate how the above-recited and other advantages and objects are obtained, a more particular description of the examples will be rendered which are illustrated in the accompanying drawings. These drawings depict only exemplary structures, and are not therefore to be considered limiting of the scope of the claims.

DETAILED DESCRIPTION

Figure 1:
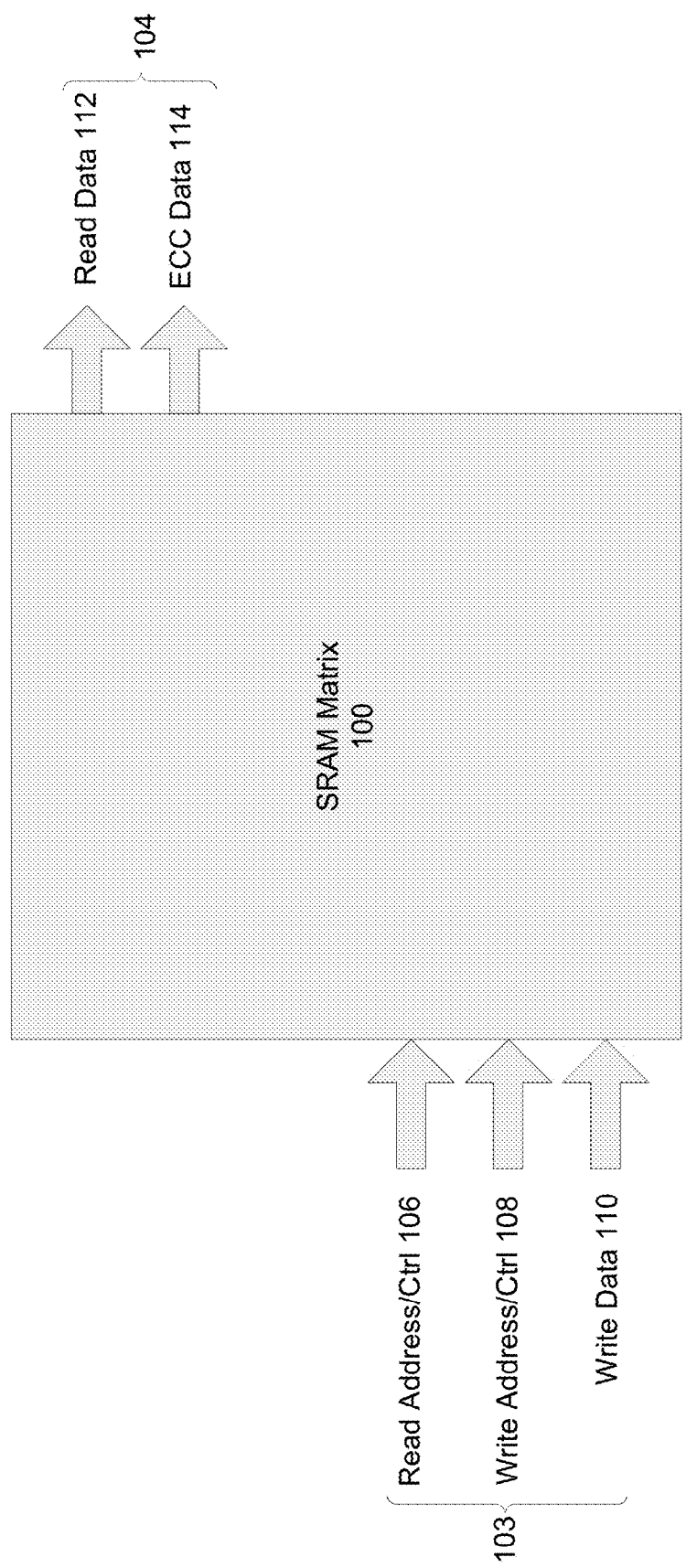
FIG. 1 illustrates a memory matrix.

Various features are described hereinafter with reference to the figures. It should be noted that the figures are not drawn to scale, and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other example, even if not so illustrated, or if not explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

FIG. 1 illustrates an exemplary memory matrix 100. In some embodiments, the memory matrix 100 is a matrix of SRAM (static random access memory) memory blocks (e.g., a plurality of SRAM columns and rows). In other embodiments, the memory matrix 100 may be a matrix of other types of memory blocks. The memory matrix 100 is a part of an integrated circuit, such as a FPGA. The memory matrix 100 has an input bus 103 and an output bus 104. Thus, from the point of view of a user, the memory matrix 100 may appear as a single large deep logic-SRAM or deep fabric-SRAM.

The input bus 103 may comprise a read address and control bus 106 for receiving read commands, a write address and control bus 108 for receiving write commands, and a write data bus 110 for receiving the data that is to be actually written onto the memory matrix 100 in response to a write command received at the write address and control bus 108.

The output bus 104 may comprise a read data bus 112 for data read from the memory matrix 100 in response to a read command received at read address and control bus 106. In addition, the output bus 104 may also contain an error correction code (ECC) bus 114. In some embodiments, the output bus 104 comprises 64 bits for read data, and 8 bits for ECC status information.

Figure 2:
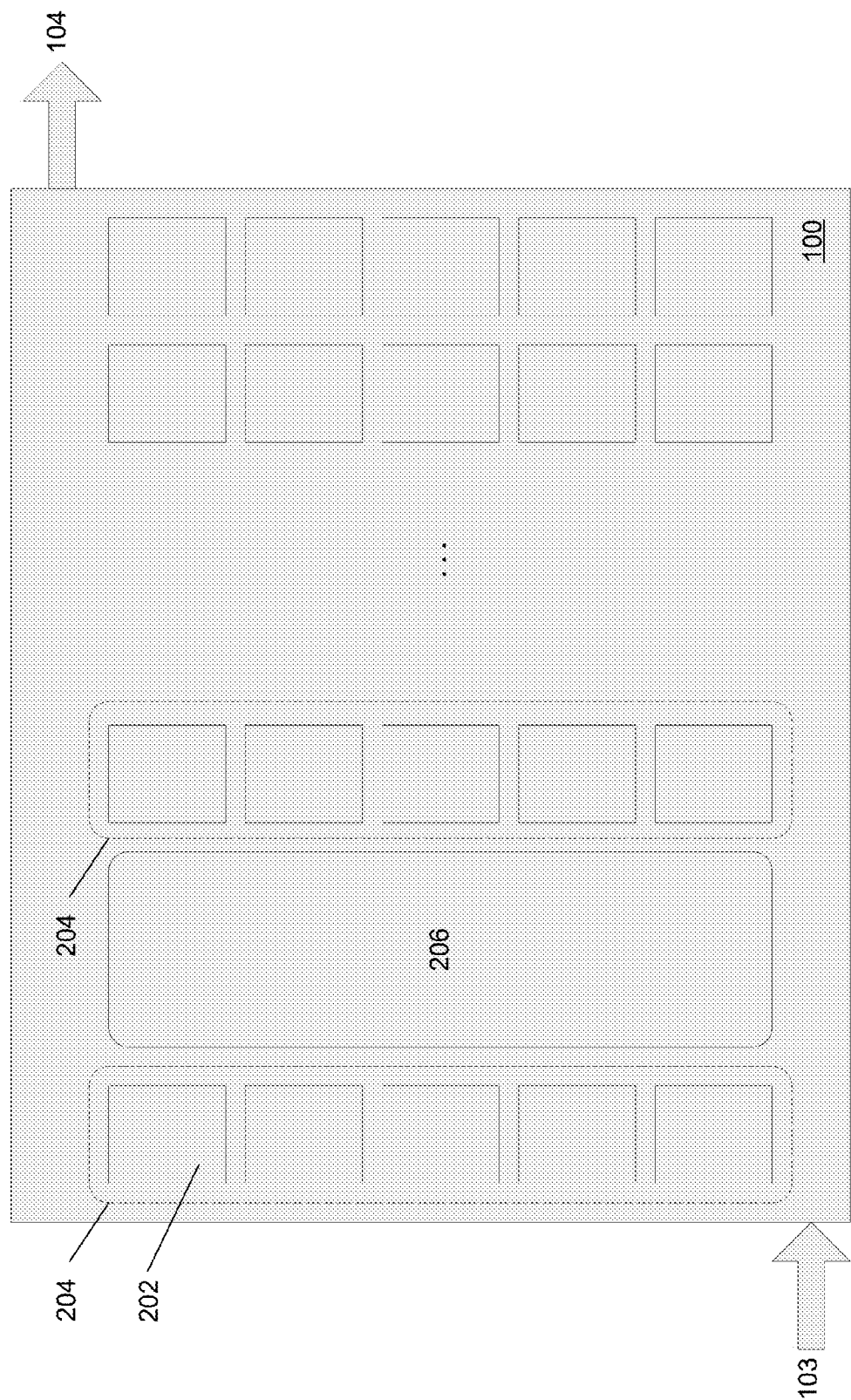
FIG. 2 illustrates a memory matrix containing a plurality of block RAMs arrange in a plurality of columns.

As illustrated in FIG. 2, the memory matrix 100 comprises a plurality of memory cell arrays 202 (hereinafter block RAM 202), which are the memory building blocks for the memory matrix 100. Block RAM 202 (or memory cell array) may refer to any type of memory cell array. For example, each block RAM 202 in the memory matrix 100 may be a 4K×72b SRAM array. The block RAMs 202 that make up the memory matrix 100 are arranged in one or more columns 204. For ease of explanation, vertical or column may refer to a direction parallel to a gate direction on an FPGA, while horizontal or row may refer to a direction perpendicular to the gate direction on the FPGA. However, it should be understood that the terms "vertical", "column", "horizontal", and "row" may be arbitrarily defined, and may refer to any directions. For example, in other embodiments, vertical or column may refer to a direction perpendicular to a gate direction on an FPGA, while horizontal or row may refer to a direction parallel to the gate direction on the FPGA.

In the memory matrix of FIG. 2, each column 204 contains an embedded cascade comprising a set of transistors and wires that stitch the block RAMs 202 of the column 204 together to form a deep logical SRAM. The embedded cascade may be hardwired within the FPGA as a dedicated bus routing, and does not consume any of the FPGA's programmable interconnect fabric. In other words, components of the cascade are not parts of the FPGA's programmable interconnect fabric. For example, the embedded cascade may route a large number of bits corresponding a size of input and output buses 103 and 104 (e.g., 72 bits) to be controlled by a single control bit. Thus, less area is consumed by each column 204 compared to if the block RAMs 202 that make up the column 204 were connected using the programmable fabric interconnect resources of the FPGA. However, in other embodiments, one or more components of the cascade may be implemented using the FPGA's programmable interconnect fabric.

For each block RAM 202 in a column 204, the embedded cascade is used to determine whether the input received by the block RAM 202 is from the FPGA fabric or from the previous block RAM 202 in the column 204. In addition, a determination is made by the embedded cascade as to whether the block RAM 202 generates its own output and pushes it into the cascade, or instead, propagates data from the previous block RAM 202 in the cascade. In some embodiments, these determinations may be done using one or more multiplexors (MUXs) located in the embedded cascade. In some cases, the MUXs are implemented in a FPGA next to the block RAMs 202, and outside the programmable fabric of the FPGA. The architecture of the embedded cascade including the MUXs will be described in further detail below.

Also, in some embodiments, individual columns 204 are connected together through the fabric interconnect, and not through an embedded cascade. This allows for flexibility in memory cell placement. For example, as illustrated in FIG. 2, additional elements 206, which may include look-up tables (LUTs) or configurable logic blocks (CLBs), may be located between columns 204 of memory matrix 100.

Constant Read Latency

In order to function effectively, the memory matrix 100 is configured to have constant read latency regardless of the address of the memory being read from. Read latency refers to the number of clock cycles from the issuance of a read address and read enable command to the memory matrix 100, to the read data being output from memory matrix 100. When the memory matrix 100 has constant read latency, then the read latency is the same regardless of the read address within the memory matrix 100 that the read data is to be read from. In addition, any data written into an address in the memory matrix 100 during one clock cycle is able to be read back in the next clock cycle.

Figure 3:
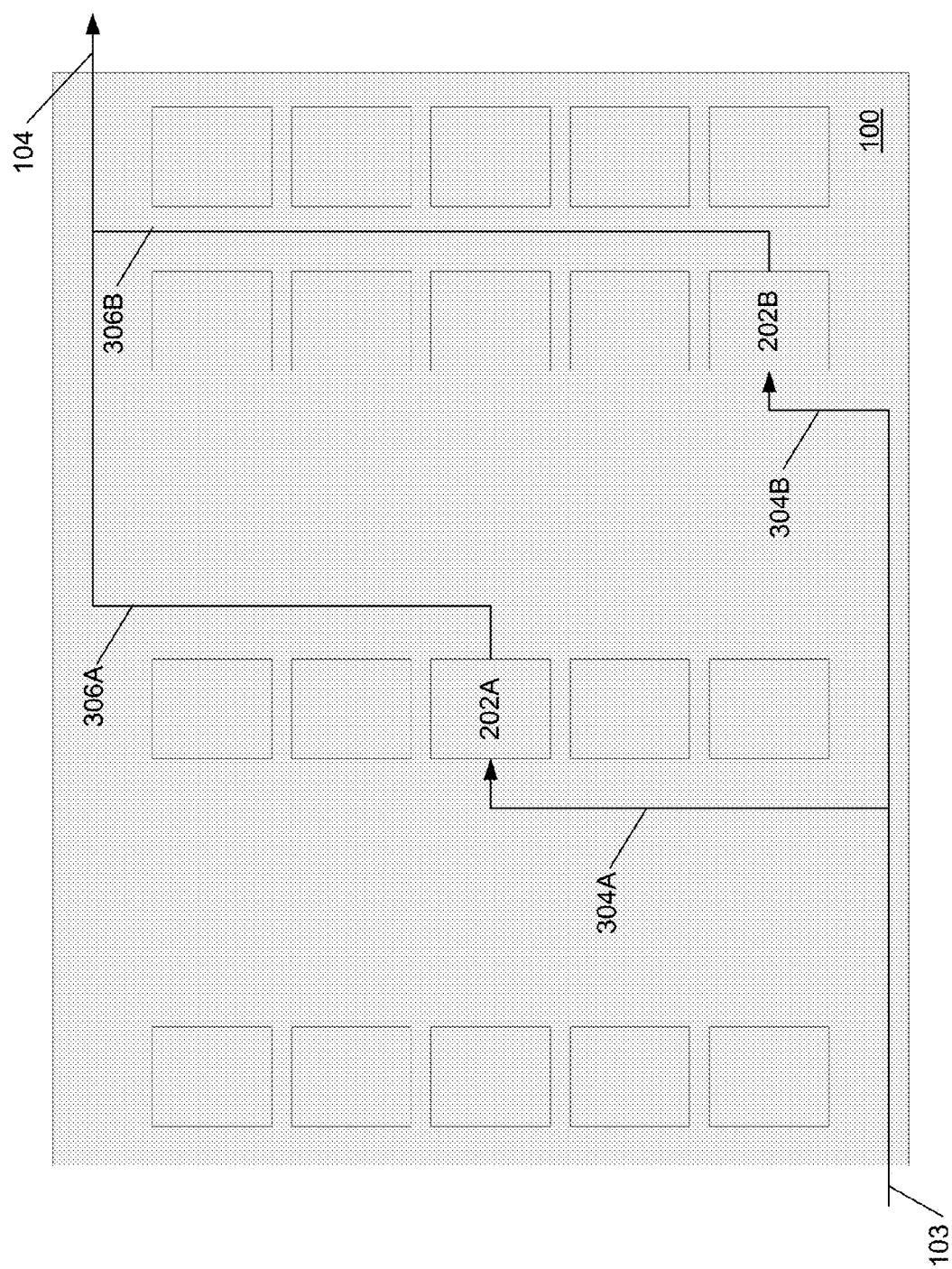
FIG. 3 illustrates a memory matrix with constant read latency.

FIG. 3 illustrates the memory matrix 100, particularly showing the memory matrix 100 having constant read latency. The memory matrix 100 contains a plurality of block RAMs 202 (e.g., block RAMs 202A and 202B) with different addresses that data can be written to and read from. For example, in order to write to block RAM 202A, a write command and address, along with write data, are sent along input wire 304A. To read data from block RAM 202A, a read command and address are sent along input wire 304A, and the read data is output using output wire 306A. Similarly, data can be written to and read from block RAM 202B using input wire 304B and output wire 306B.

In order to achieve constant read latency, the total delay of the input and output wires should be the same regardless of the position of the block RAM 202 in the memory matrix 100 that is being accessed. For instance, block RAM 202A and block RAM 202B will have the same read latency if the delay across 304A and 306A is the same as the delay across 304B and 306B. Because the delay of a wire is proportional to the length of the wire, the input bus 103 and output bus 104 may be located on opposite corners of the memory matrix 100 such that the total delay of the input and output wires will be proportional to half of the perimeter of the memory matrix 100. Therefore, consistent pipelining should be used in input and output buses 103 and 104, in order to ensure that delay over horizontal-running wires will be relatively constant. At the same time, delay in the vertical direction from vertical-running wires (i.e., the embedded cascades in each column 204) will match due to each column 204 in memory matrix 100 having the same architecture. In other embodiments, input and output buses 103 and 104 may be located on other parts of memory matrix 100, so long as total horizontal delay and total vertical delay are made relatively constant regardless of the address being read from.

It is understood that write latencies (number of clock cycles from issuance of write address, enable command, and data to the memory matrix 100, to when the data is written to the memory cell at the specified address) may be different for different addresses in memory matrix 100. For example, while the total delay of input and output wires 304A and 306A together may be the same as that of input and output wires 304B and 306B together (thus achieving constant read latency), the delay of input wire 304A may be different from that of input wire 304B. However, there is typically no need for constant write latencies, as data written into a block RAM 202 is not observed until a read request is received. As long as there is constant read latency and the longest write latency is no worse than the read latency, consistency is maintained such that a read to a particular address after a write to that same address will read the data that was written, and that read data will be received in the same order that it is requested.

Pipelining and Cascades

Figure 4:
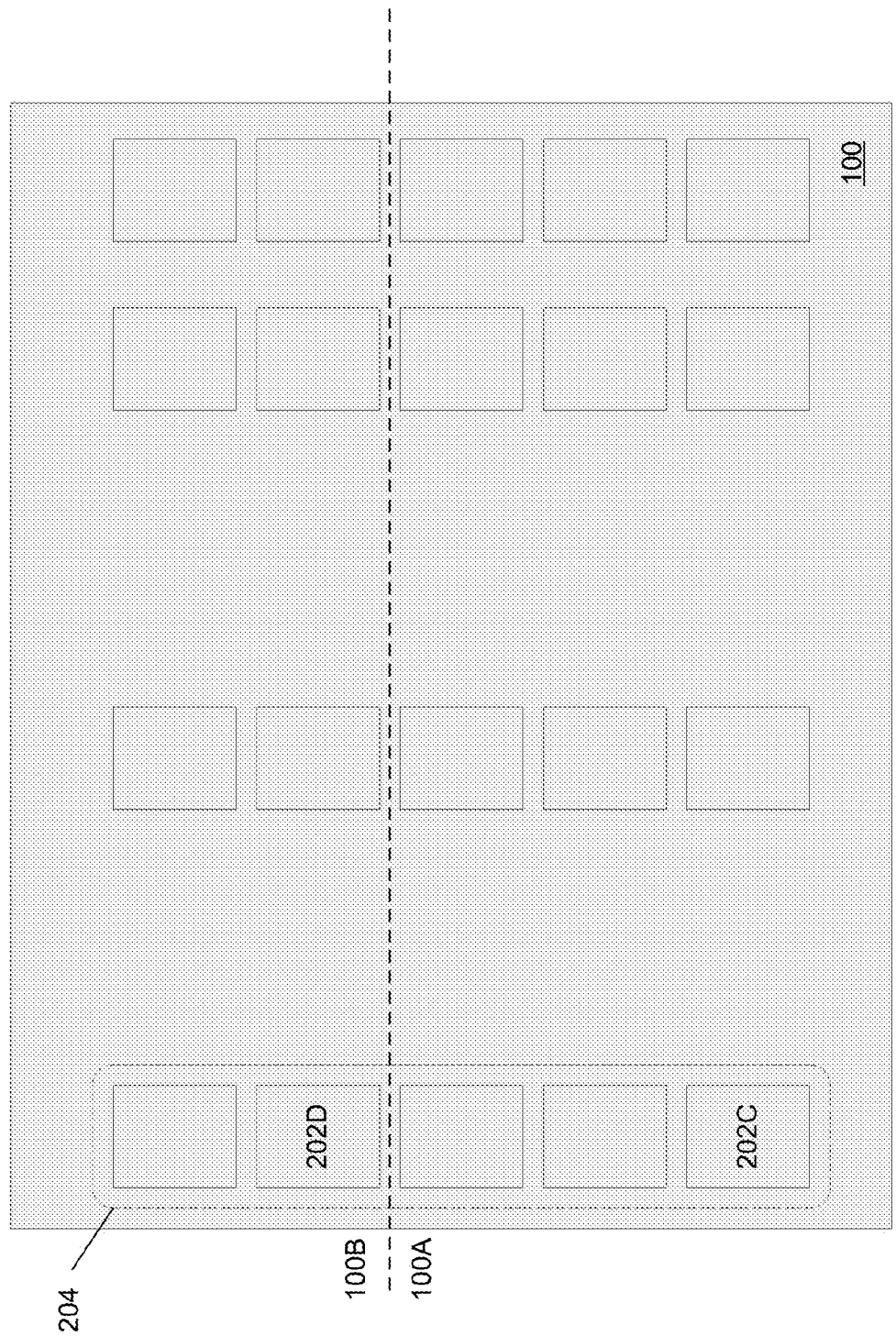
FIG. 4 illustrates a memory matrix with pipelining.

In some embodiments, a user may divide the columns 204 of the memory matrix 100 into a plurality of pipeline stages. For example, FIG. 4 illustrates a memory matrix 100 divided into two separate memory matrices 100A and 100B. Thus column 204 of the memory matrix 100 is divided into two separate cascades, a first cascade that begins at block RAM 202C, and a second cascade that begins at block RAM 202D. In other embodiments, a column 204 of the memory matrix 100 may be divided into more than two separate cascades.

In some embodiments, pipelining the memory matrix 100 into multiple memory matrices may be done based upon the speed at which the memory matrix 100 is run. For example, if the memory matrix 100 is being run at a clock rate such that each clock cycle runs over a total of four block RAMs 202, then each column 204 of the memory matrix 100 may be divided into multiple stages, each stage containing a cascade of four block RAMs 202. In other embodiments, pipelining the memory matrix 100 into multiple memory matrices may be done based upon any other criteria chosen by a user.

In order to allow user-defined pipelining and cascades, each block RAM (memory cell array) 202 in a column 204 is associated with one or more MUXs controlled by a flip-flop that specifies whether the block RAM 202 is the first block RAM in a cascade or not. If a block RAM 202 is the first block RAM in its cascade, then it receives its input data (read/write commands, address, write data, etc.) from the FPGA interconnect fabric. However, if a block RAM 202 is not the first block RAM in its cascade, then it instead receives its input data from the cascade.

Figure 5A:
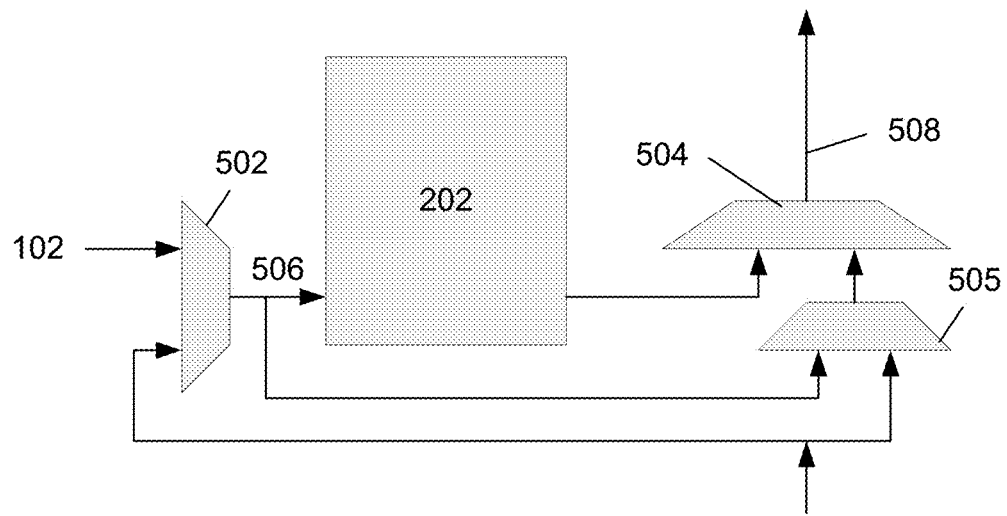
FIG. 5A illustrates a cascade configuration for a block RAM.
Figure 5B:
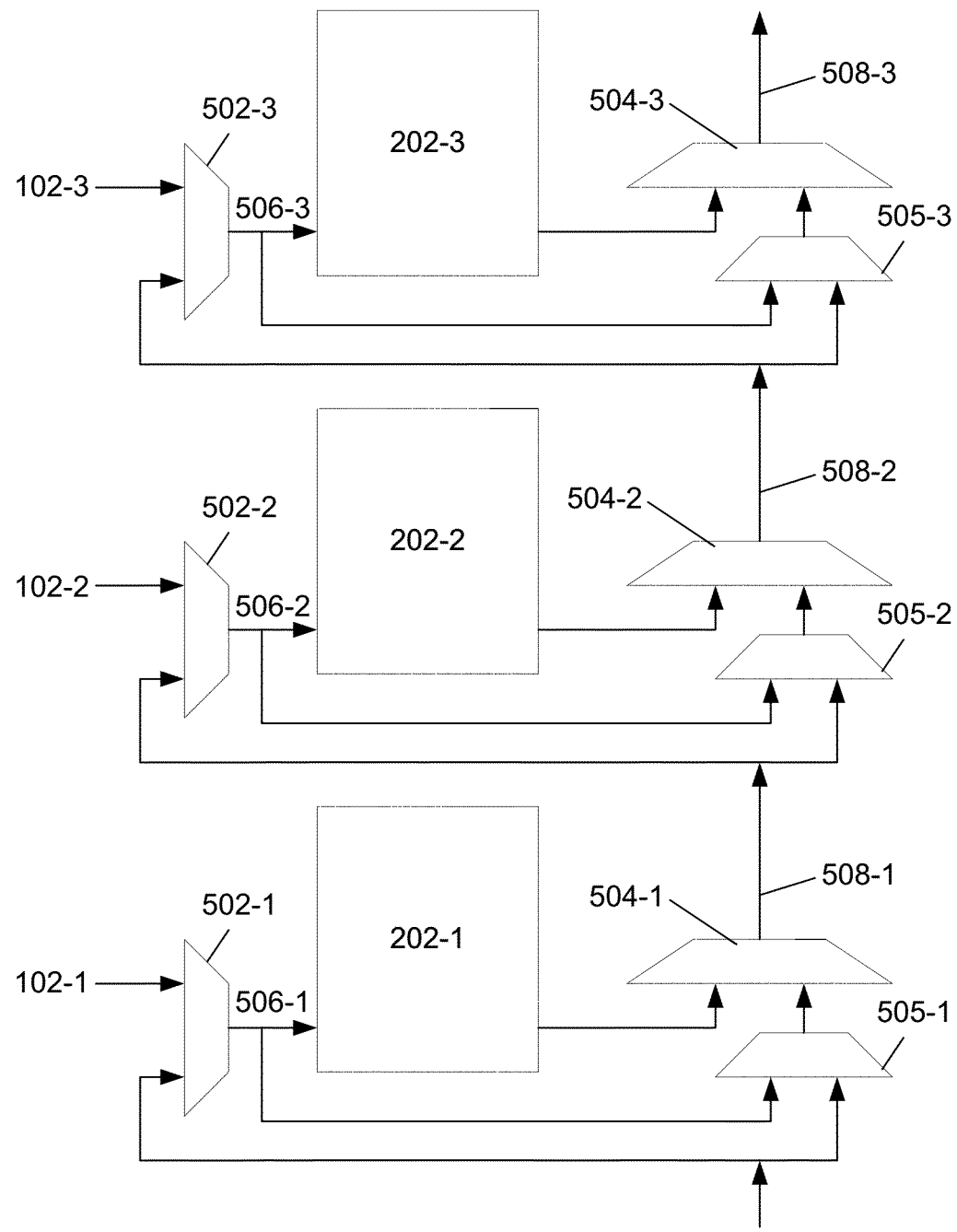
FIG. 5B illustrates a plurality of block RAMs cascaded together using the configuration illustrated in FIG. 5A.

FIG. 5A illustrates an exemplary cascade configuration for a block RAM (memory cell array) 202. FIG. 5B illustrates a plurality of block RAMs 202 as a part of a column 204 cascaded together using the configuration illustrated in FIG. 5A. While FIG. 5B shows three block RAMs 202-1, 202-2, and 202-3, it is understood that any number of block RAMs 202 may be part of a column 204. In these figures, each wire may be the full width of input and output buses 103 and 104 (e.g., 72 bits).

In the illustrated examples, each block RAM 202 (e.g., block RAM 202-1/202-2/202-3) in a cascade is associated with a respective first routing MUX 502 (e.g., routing MUX 502-1/502-2/502-3), a second routing MUX 505 (e.g., routing MUX 505-1/505-2/505-3) and a read/write (R/W) cascade MUX 504 (e.g., R/W cascade MUX 504-1/504-2/504-3). During use, a block RAM 202 of a cascade stage may receive input data 506 (e.g., input data 506-1/506-2/506-3). Also, during use, the R/W cascade MUX 504 and the routing MUX 505 may operate together to cascade an output 508 (e.g., output 508-1/508-2/508-3) to a next cascade stage (which includes the next block RAM 202). In some embodiments, output of a block RAM 202 may be connected to an output bus in the FPGA fabric, which may be configured via the FPGA bitstream to accept the output (e.g., if block RAM 202 is the last stage of the cascade), or ignore it if (e.g., if block RAM 202 is not the last stage of the cascade).

As shown in FIG. 5B, the R/W cascade MUX 504-1 is coupled to the R/W cascade MUX 504-2 through the routing MUX 505-2, and the R/W cascade MUX 504-2 is coupled to the R/W cascade MUX 504-3 through the routing MUX 505-3.

When a block RAM 202 receives an input 506, the block RAM 202 checks that the address contained within the input matches the address of the block RAM 202 in order to determine whether any action is to be taken on the block RAM 202. In some embodiments, the address is checked using an embedded address decoder (an example of which is described below).

In some embodiments, each routing MUX 502 is a 2:1 MUX, and is configured to determine the input 506 for a block RAM 202. When a block RAM 202 is the start of a cascade, then it receives its input data (e.g., input data 102-1/102-2/102-3) from the FPGA interconnect fabric through the input bus 103 (shown in FIG. 3). However, if a block RAM 202 is not the start of a cascade, then it receives as input the cascaded output 508 of the previous cascade stage (containing the previous block RAM 202 in the cascade).

Each routing MUX 505 may also be a 2:1 MUX. When a block RAM 202 is the start of a cascade, routing MUX 505 passes input data 102 (through 506) to R/W cascade MUX 504. However, if a block RAM 202 is not the start of a cascade, then routing MUX 505 passes to R/W cascade MUX 504 the output data from a previous stage of the cascade.

Thus, a user is able to configure the cascades in a column 204 by configuring the select control inputs of routing MUXs 502 and 505. Once configured during the routing phase, the select control inputs of routing MUXs 502 and 505 may remain constant (e.g., if a particular block RAM 202 is the start of a cascade, then its associated routing MUX 502 always selects the data from input bus 103).

In the illustrated examples, the R/W cascade MUX 504 is configured to determine the cascade output 508 to be passed downstream. The R/W cascade MUX 504 may be a 2:1 MUX, and may be configured to receive as input (1) the read data of its associated block RAM 202, or (2) the output data of routing MUX 505. In some embodiments, the data output by R/W cascade MUX 504 may be determined by the type of command received (read or write) and whether its associated block RAM 202 is the target of the command (e.g., whether the address of block RAM 202 matches the address specified in the command). Exemplary functions for R/W cascade MUX 504 are illustrated in table 1 below:

TABLE 1

| Type of command | Address match? | Selection of MUX 504 |
| --- | --- | --- |
| Write | Yes/No | Cascaded data from MUX 505 |
| Read | No | Cascaded data from MUX 505 |
| Read | Yes | Read data from block RAM 202 |

For example, if the input command 102 is a write request, then R/W cascade MUX 504 will select the data output by routing MUX 505. Thus, a write command received at a first stage of the cascade is cascaded to all block RAMs 202 in the cascade. If the input command 102 is a read request, but the block RAM 202 associated with the R/W cascade MUX 504 is not the target of the command (e.g., address does not match), then R/W cascade MUX 504 will also select the data output by routing MUX 505. However, if the input command 102 is a read request, and the block RAM 202 associated with the R/W cascade MUX 504 is the target of the command, then R/W cascade MUX 504 will select the read data output of block RAM 202, so that it may be cascaded to the output.

In some embodiments, the R/W cascade MUX 504 at a given stage of the cascade may be configured to pass (1) an output 506 from the routing MUX 502 at that stage of the cascade (e.g., received through the routing MUX 505 at that stage, or directly from the routing MUX 502 at that stage) downstream, (2) an output from the block RAM 202 at that stage of the cascade downstream, or (3) an output from the R/W cascade MUX 504 at the previous stage of the cascade (e.g., received through the routing MUX 505 at the current stage, or directly from the R/W cascade MUX 504 at the previous stage) downstream. For example, in some embodiments, the R/W cascade MUX 504 at a given stage of the cascade may receive an output from the block RAM 202 at that stage of the cascade, and an output 506 from the routing MUX 502 at that stage of the cascade (received through the routing MUX 505 at that stage or directly from the routing MUX 502), and select one of these outputs for passage downstream. As another example, in some embodiments, the R/W cascade MUX 504 at a given stage of the cascade may receive an output from the block RAM 202 at that stage of the cascade and an output 508 from the R/W cascade MUX 504 at the previous stage (received through the routing MUX 505 at the current stage, or directly from the R/W cascade MUX 504 at the previous stage), and select one of these outputs for passage downstream. In further example, the routing MUX 505 at a given stage may be omitted, and the R/W cascade MUX 504 at a given stage of the cascade may receive an output from the block RAM 202 at that stage of the cascade, an output 506 from the routing MUX 502 at that stage of the cascade, and an output 508 from the R/W cascade MUX 504 at the previous stage, and select one of these three outputs for passage downstream.

In other embodiments, the R/W cascade MUX 504 may be a 3:1 MUX, a 4:1 MUX, or any of other types of MUX. In some embodiments, R/W cascade MUX 504 may be combined with routing MUX 505 as a single MUX. For example, a single 3:1 MUX may be used to implement both the R/W cascade MUX 504 and the routing MUX 505. In other embodiments, the R/W cascade MUX 504 and the routing MUX 505 may be considered a components of a MUX, which includes the R/W cascade MUX 504 and the routing MUX 505. Thus, as used in this specification, the term "MUX" or similar term may refer to one or more MUXs.

Figure 5C:
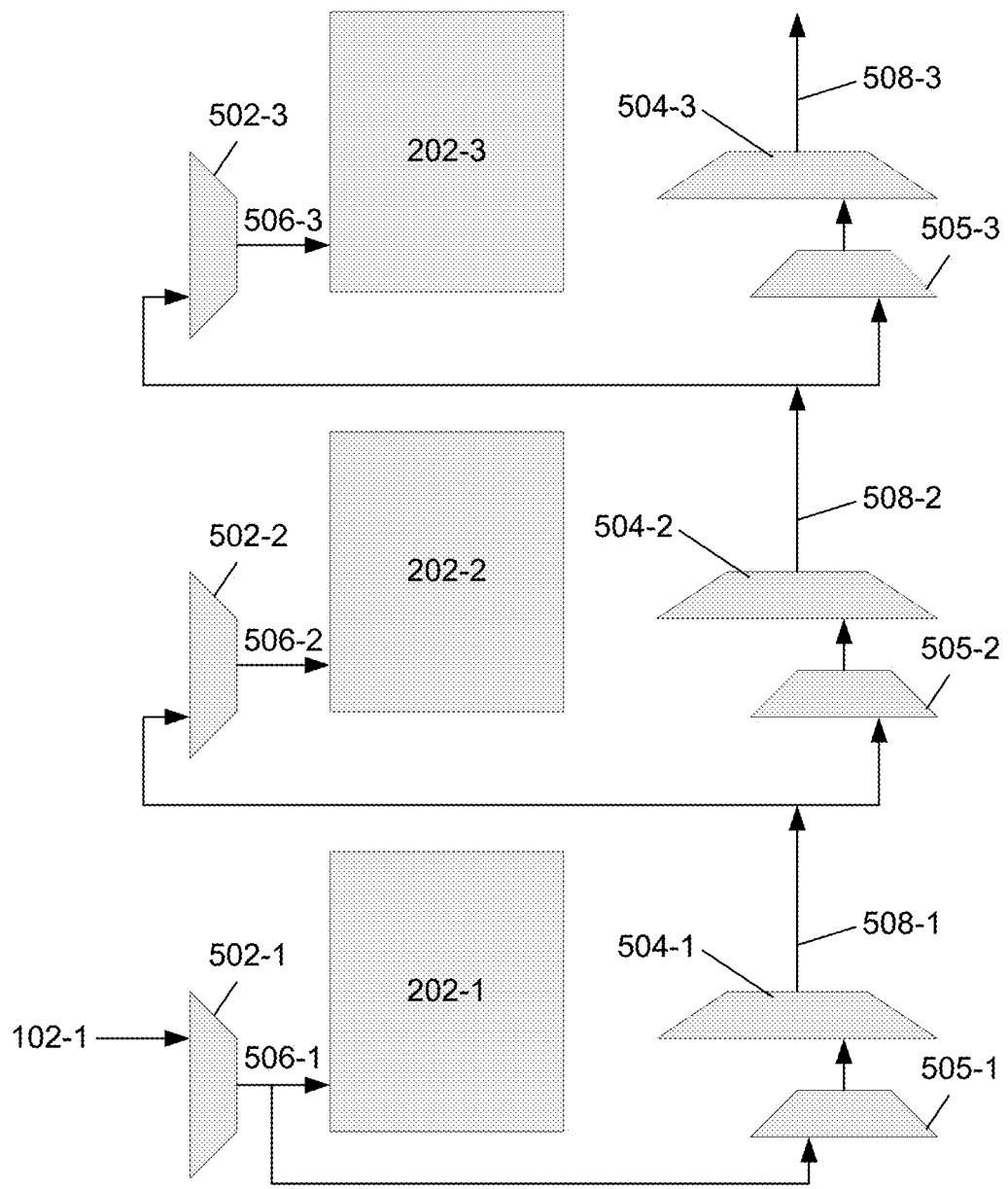
FIGS. 5C and 5D illustrate examples of the cascade of FIG. 5B in operation.
Figure 5D:
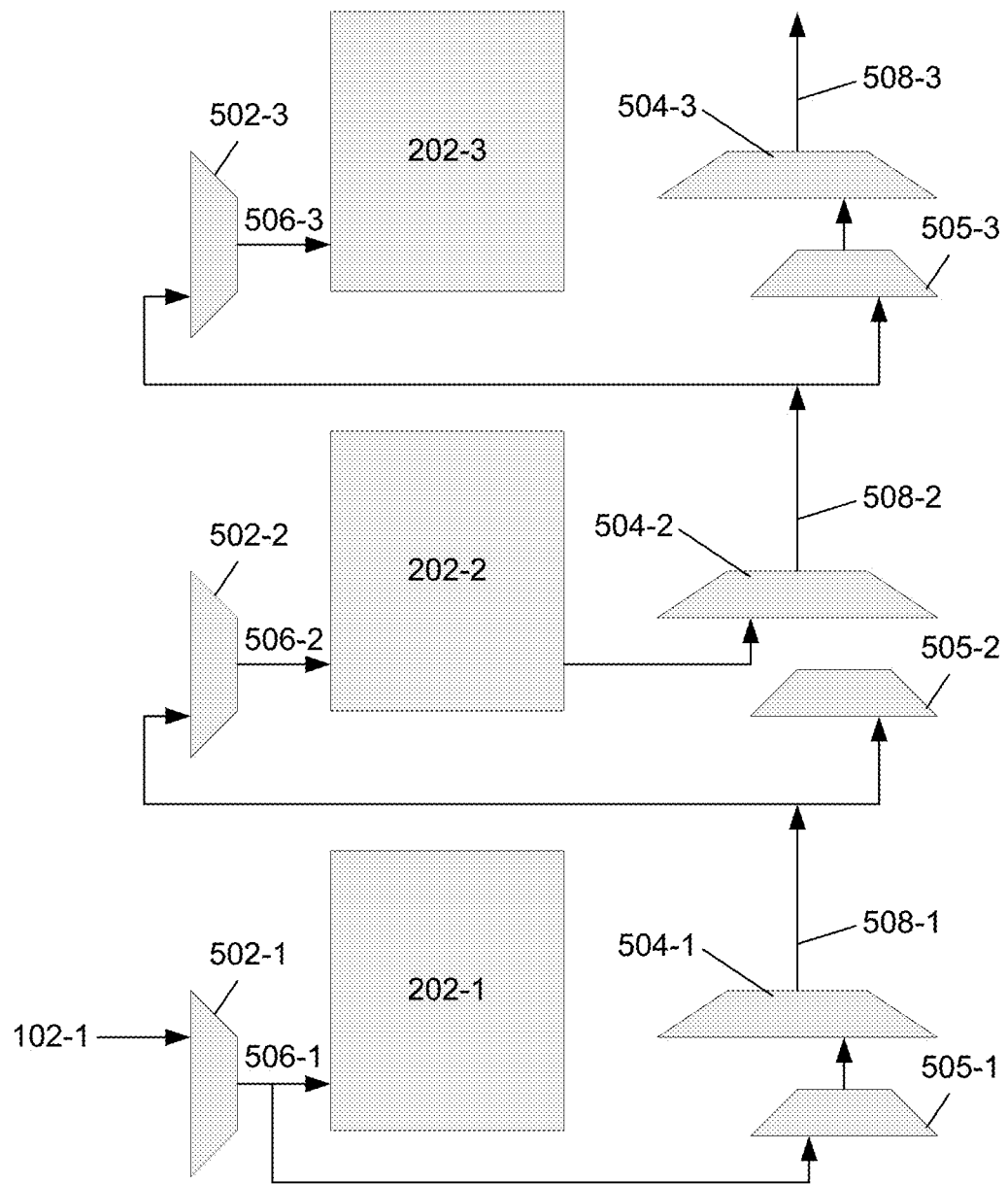

FIGS. 5C and 5D illustrate examples of the cascade of 5B in operation. FIG. 5C illustrates a write command being issued to block RAM 202-3, wherein the start of the cascade is block RAM 202-1. An input data 102-1 is received at the start of the cascade by MUX 502-1, comprising the write command specifying a write address corresponding to block RAM 202-3, and write data. Block RAM 202-1 is the start of the cascade, so MUX 502-1 passes through input data 102-1 as 506-1, which is received by block RAM 202-1 and routing MUX 505-1.

Routing MUX 505-1 and R/W cascade MUX 504-1 will pass the write command and write data as data 508-1 to MUXs 502-2 and 505-2 of the second stage of the cascade. Because block RAM 202-2 is not the start of the cascade, MUX 502-2 passes through cascaded data 508-1 as input data 506-2. In addition, MUXs 505-2 and 504-2 will cascade data 508-1 to the next stage of the cascade, and so forth, such that the block RAMs 202 for each stage of the cascade, regardless of address, receives the write command and write data.

Because the address of block RAM 202-1 does not match the address specified by the write command, the write data is not written into block RAM 202-1. Similarly, because the address of block RAM 202-2 does not match the address specified by the write command, the write data is not written into block RAM 202-2. However, because the address of block RAM 202-3 matches the address specified in the write command, the write data is written to block RAM 202-3.

It should be understood that FIG. 5C does not show all of the input and output of the MUXs 502, 504, 505, and that FIG. 5C shows only some of the signals that are passed downstream for illustrative purpose.

FIG. 5D illustrates an example of a read command being issued to block RAM 202-2, wherein the start of the cascade is block RAM 202-1. A read command (input data) 102-1 specifying a read address is received at MXU 502-1 and passed by MUX 502-1 to routing MUX 505-1 as data 506-1. Because the address of block RAM 202-1 does not match the address specified in the read command, data is not read from block RAM 202-1, and routing MUX 505-1 passes data 506-1 containing the read command to the next stage of the cascade (through R/W cascade MUX 504-1). The read command is then received by MUX 502-2 of the next stage of the cascade, and passed to block RAM 202-2. Because the address of block RAM 202-2 matches the address specified by the read command, data is read from block RAM 202 and passed to R/W cascade MUX 504-2, which cascades the data (represented by output 508-2) to the next stage of the cascade. Subsequent stages of the cascade will continue to cascade the read data (e.g., as data 508-3, as so forth) due to the addresses of their associated block RAMs 202 not matching the address specified in the read command.

It should be understood that FIG. 5D does not show all of the input and output of the MUXs 502, 504, 505, and that FIG. 5D shows only some of the signals that are passed downstream for illustrative purpose.

Figure 6A:
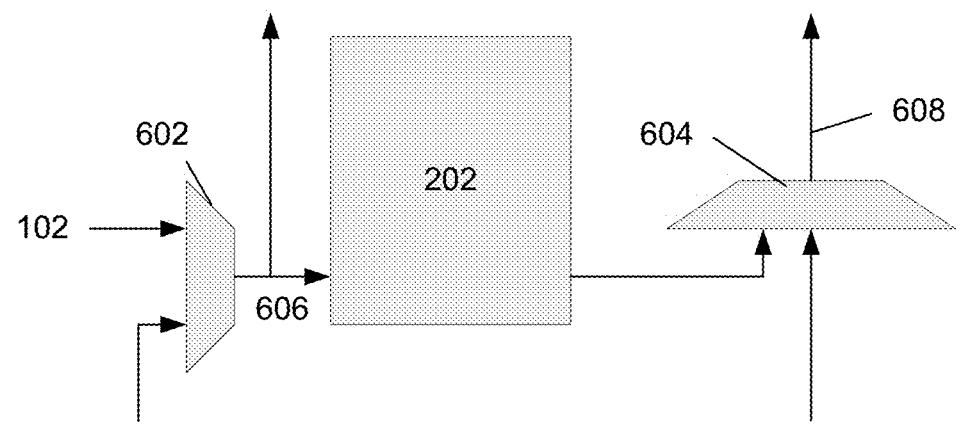
FIG. 6A illustrates an alternate cascade configuration for a block RAM.
Figure 6B:
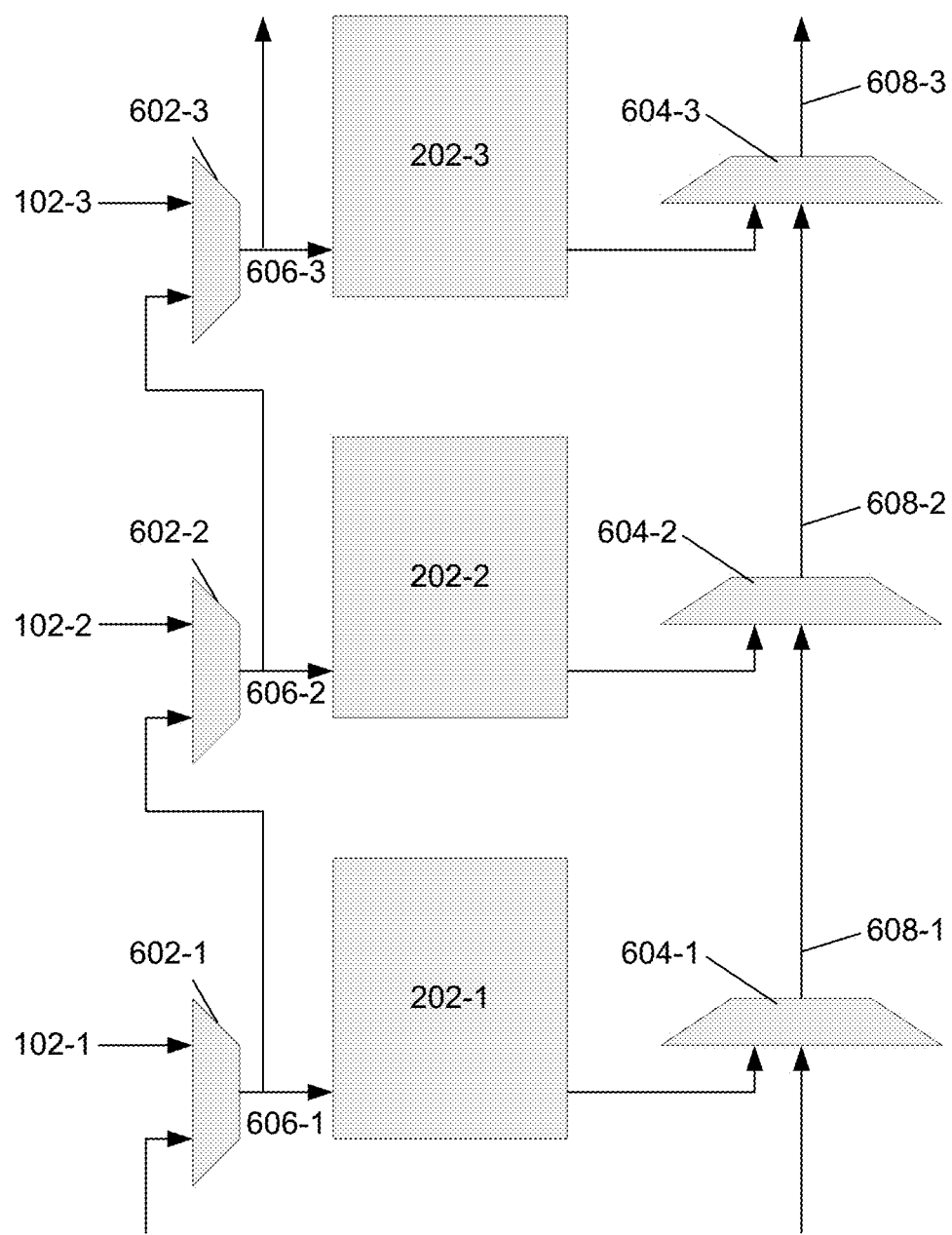
FIG. 6B illustrates a plurality of block RAMs cascaded together using the configuration illustrated in FIG. 6A.

FIG. 6A illustrates an alternate cascade configuration for a plurality of block RAMs (memory cell arrays) 202 as a part of a column 204. FIG. 6B illustrates a plurality of block RAMs 202 as a part of a column 204 cascaded together using the configuration illustrated in FIG. 6A. Unlike the example of FIG. 5A, write data and read data are cascaded separately. Therefore, each block RAM 202 is associated with an input (or write) cascade MUX 602, and an output (or read) cascade MUX 604.

Input cascade MUX 602 (e.g., input cascade MUX 602-1/602-2/602-3) is a 2:1 MUX, and is configured to determine the input 606 (e.g., input 606-1/606-2/606-3) for a respective block RAM 202 (e.g., block RAM 202-1/202-2/202-3). When block RAM 202 is the start of a cascade, then it receives its input data (e.g., input data 102-1/102-2/102-3) from the FPGA interconnect fabric through bus 103 (shown in FIG. 3). However, if a block RAM 202 is not the start of a cascade, then it receives as input the cascaded input of the previous block RAM 202 in the cascade. In the illustrated example, the block RAM 202-1 is the first one in an order of the cascade. Thus, MUX 602-1 is configured to receive input 102-1 from the FPGA interconnect fabric (through the bus of FIG. 3), and pass such input as input 606-1 to the block RAM 202-1. In another example, the block RAM 202-2 may be configured to be the first one in an order of the cascade. Thus, MUX 602-2 in this example may be configured to receive input 102-2 from the FPGA interconnect fabric (through the bus of FIG. 3), and pass such input as input 606-2 to the block RAM 202-2.

Thus, a user is able to configure the cascades in a column 204 by configuring the input cascade MUXs 602 for the respective block RAMs 202. For example, if block RAM 202-1, as illustrated in FIG. 6B, is the first block RAM in a cascade, then it receives as its input 606-1 the input data 102-1 from the fabric, which may be a read command or a write command. The command is then cascaded to the remaining block RAMs 202 in the cascade (e.g., block RAMs 202-2 and 202-3) through their respective input cascade MUXs (602-2 and 602-3).

Output cascade MUX 604 (e.g., output cascade MUX 604-1/604-2/604-3) is a 2:1 MUX used to select either (1) a read output of block RAM 202, or (2) a cascaded read output from the previous stage of the cascade, for passage downstream. The selection of output cascade MUX 604 may be based upon whether the address of its associated block RAM 202 matches the address specified in the input command. For example, if the command is a read command for block RAM 202-2, then output cascade MUX 604-2 will pass the read data of block RAM 202-2 as cascade output 608-2, which is then cascaded through the remaining stages of the cascade to be output. The output cascade MUXs 604 for other stages (e.g., output cascade MUXs 604-1, 604-3, etc.) will pass the data from the previous stage of the cascade (e.g., due to the addresses of block RAMs 202-1, 202-3 not matching the address of the command).

The configuration illustrated in FIG. 6A has several advantages over the configuration of FIG. 5A. First, in the configuration illustrated in FIG. 5A, for each cascade stage, the cascade wires for data 508 may need to extend from one side of the column 204 to the other. On the other hand, the configuration of FIG. 6 is able to have fewer horizontal cascade wires, as the input cascade may be entirely on one side of column 204, and the output cascade may be entirely on the opposite side of the column 204, with no need for wires crossing over the width of column 204. This may be advantageous, as it reduces the quantity of horizontal wiring needed to implement the cascade, which may reduce the area of the FPGA consumed by the embedded cascade. In addition, by having two separate cascades (input cascade and output cascade), clocks can be independently tuned for each in order to improve or maximize performance. However, in some embodiments where the FPGA has greater vertical wire congestion compared to horizontal wire congestion, the structure illustrated in FIG. 5 may be preferable due to it having less vertical cascade wires. For example, the FPGA illustrated in FIG. 5 may require two horizontal buses (e.g., 72-bit buses) and one vertical bus, while the example illustrated in FIG. 6 may require two vertical buses and one horizontal bus. Therefore the amount of vertical wire congestion on the FPGA relative to the amount of horizontal wire congestion may be used to determine which type of configuration to use.

Address Decoder

In some embodiments, an embedded address decoder may be used to facilitate timing closure. The memory matrix 100 may contain many block RAMs 202, each of which may contain many memory cells. An embedded address decoder may use a portion of a received address to identify a particular block RAM 202 of memory matrix 100 (e.g., to activate, to receive a particular command, etc.), while the remainder of the address may be used to select a particular memory cell within the activated block RAM 202.

Figure 7:
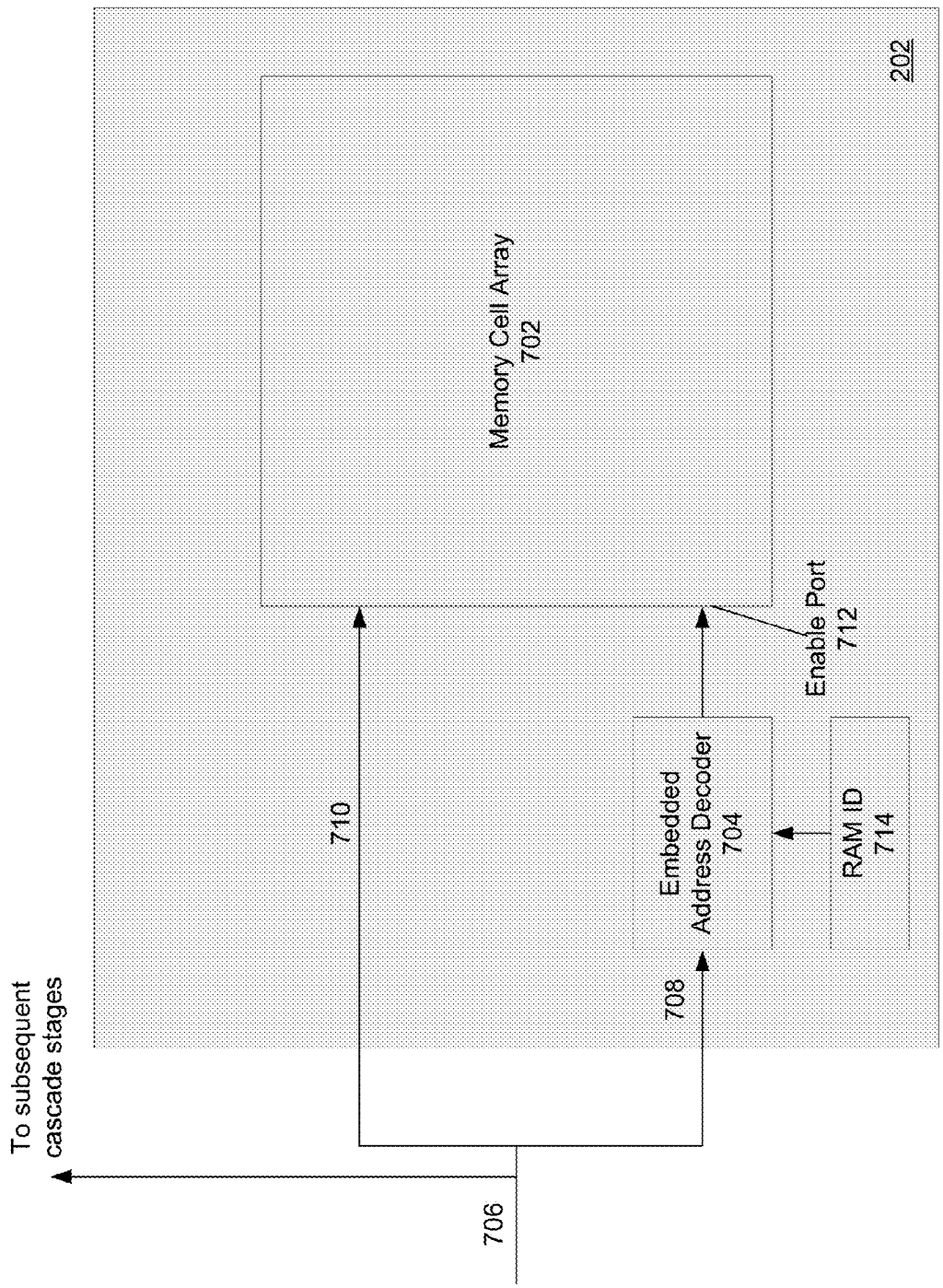
FIG. 7 illustrates a block RAM having an embedded address decoder.

FIG. 7 illustrates a block RAM 202 having an embedded address decoder. The block RAM 202 contains a memory cell array 702 having an enable port 712. In addition, the block RAM 202 comprises an embedded address decoder 704.

A received command (input) comprises an address 706. Address 706 may be divided into a first address portion 708 and a second address portion 710. In some embodiments, the first address portion 708 may comprise the high address bits of the address 706, while second address portion 710 comprises the low address bits of the address 706.

In some embodiments, each block RAM 202 in a memory matrix 100 is assigned a statically programmable RAM ID. When the address 706 is received, the first address portion 708 may then be used to specify an ID of a block RAM 202 in the memory matrix that is to receive the command. For example, if a particular memory matrix 100 contains 64 block RAMs 202, then the first address portion 708 may comprise at least 6 bits, in order to cover 64 different block RAM IDs. In the illustrated examples, the address decoder 704 receives the first address portion 708 to determine whether block RAM 202 is to receive the command (e.g., by comparing first address portion 708 to a RAM ID 714). If the ID of a block RAM 202 matches that of the first address portion 708, then that block RAM 202 is activated. For example, in some embodiments, address decoder 704 sends a two bit signal to enable port 712, wherein a first bit of the two bit signal is an enable bit, and a second bit specifies read or write (e.g., a 00 signal means that RAM 202 is not activated, a 10 signal activates RAM 202 for writing, while a 11 signal activates RAM 202 for reading).

The second address portion 710 corresponds to an address within the memory cell array 702. For example, if the memory cell array 702 is an SRAM having 4 k entries, then the first address portion 708 requires at least 12 bits for the total number of entries. If the block RAM 202 is activated (due to matching the ID specified by the first address portion 708), then second address portion 710 may be used to determine the specific memory cell in the block RAM 202 to access.

In some embodiments, multiple block RAMs 202 may be programmed to have the same ID, allowing data to be multicasted. This may be used in some embodiments where read bandwidth exceeds write bandwidth, allowing for multiple read ports to be used with a single write port. Thus a write command from a write port will write the data to a plurality of block RAMs 202 having the same ID, which can then be read by the plurality of read ports.

Double Pump

In the above examples, the memory matrix 100 has one read/write port (one input bus 103 and one output bus 104). In some embodiments, the speed that the memory matrix 100 may be run at exceeds the speed of the FPGA (e.g., the memory matrix 100 may be run at 1 GHz, while the FPGA may be run at 500 MHz). Thus, a clock speed of the memory matrix 100 may be faster than a clock speed of the FPGA. In such cases, the memory matrix 100 may be "double-pumped" such that it behaves as if it is operating with two ports, by alternating commands from a first port and a second port. This may be done to save area on the FPGA, as a memory matrix with a single double-pumped port typically occupies less area compared to a memory matrix having two separate slower-running ports.

Figure 8:
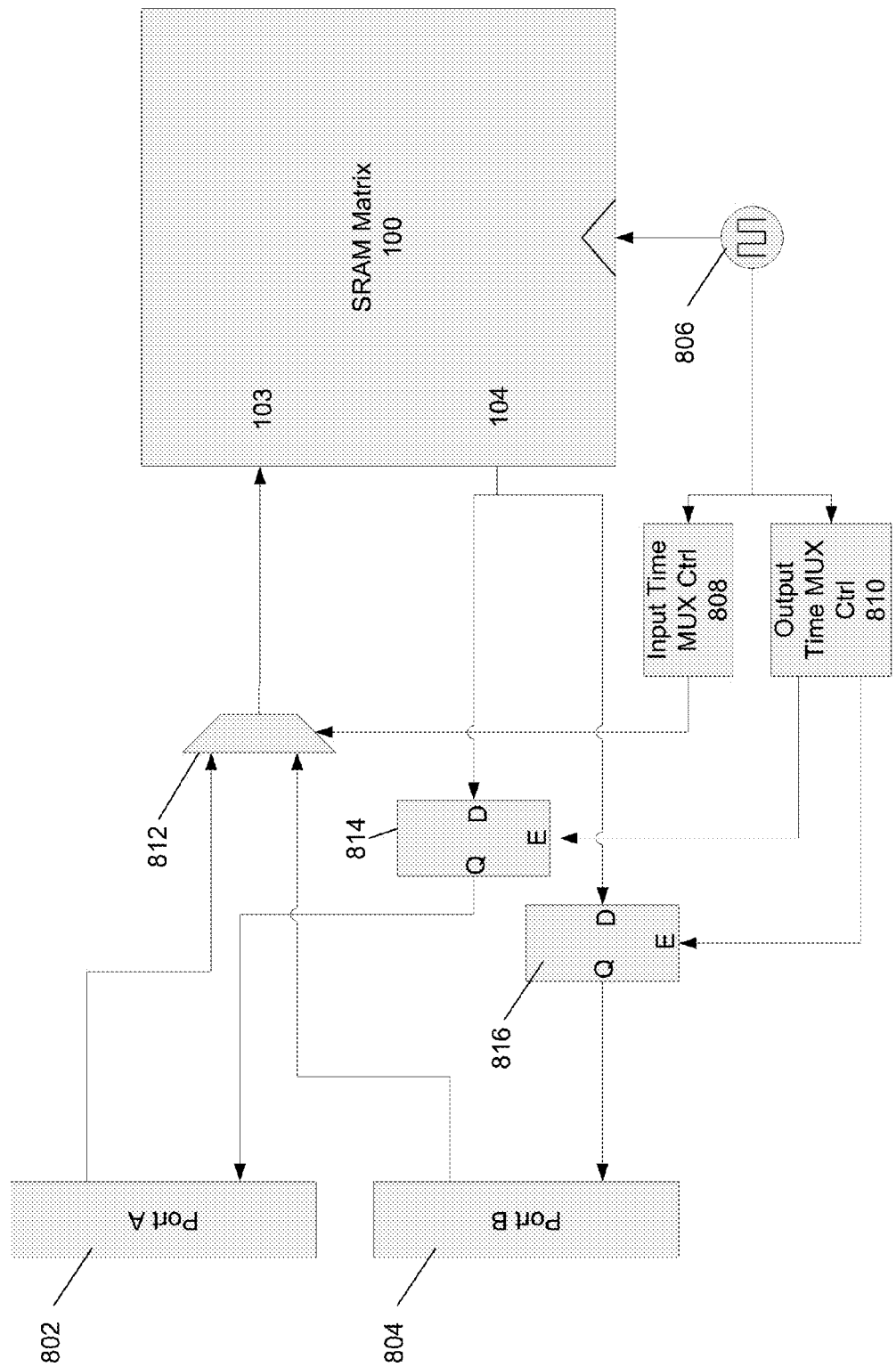
FIG. 8 illustrates a double-pumped single port memory matrix.

FIG. 8 illustrates a circuit component that includes a double-pumped single port memory matrix 100. The memory matrix 100 is configured to receive commands generated from multiple ports (e.g., from a first port 802 and a second port 804, which generate commands at a rate based upon a speed of the FPGA clock). The circuit also includes a clock 806 for the memory matrix 100, configured to provide a clock signal to an input time MUX controller 808 and an output time MUX controller 810, which respectively control an input MUX 812 and demultiplexors (deMUXs) 814 and 816.

The input MUX 812 is configured to select a command from ports 802 and 804 to be received by memory matrix 100 through the input bus 103. The selection of the command by the input MUX 812 is performed in response to a clock signal from the clock 806 that controls the MUX controller 808. Read data from the memory matrix 100 is performed in response to the received commands to output through output bus 104. The output is passed to deMUXs 814 and 816, which control whether the data reaches ports 802 and 804, respectively, based on a control by the MUX controllers 808, 810 (which control is based on a clock signal from the clock 806). The memory matrix 100 is thus able to alternately process commands from both ports 802 and 804.

Figure 9:
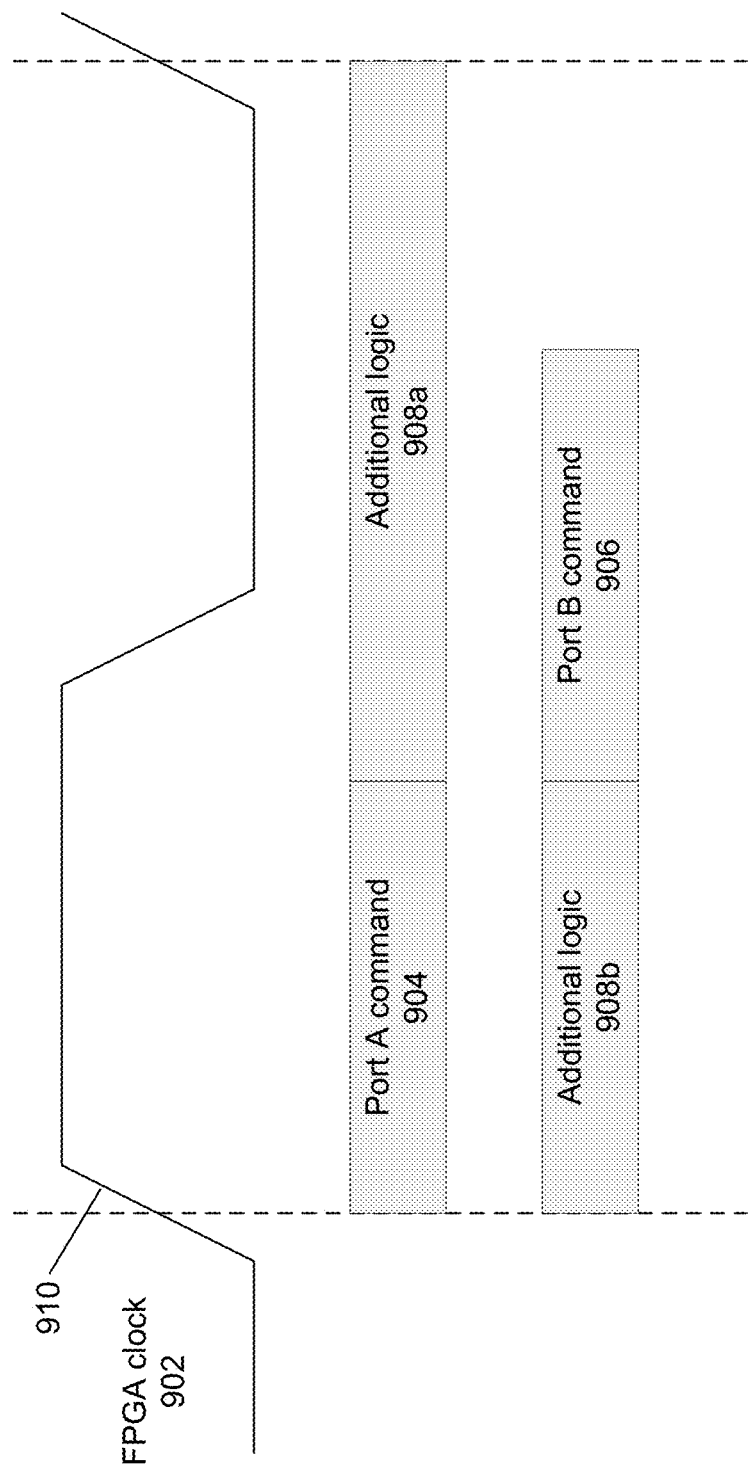
FIG. 9 illustrates a clock cycle of an FPGA containing a double-pumped memory matrix.

FIG. 9 illustrates a clock cycle of an FPGA containing a double-pumped memory matrix 100. For the purposes of the specification, Port A is used to refer to the port whose command is executed by the memory matrix 100 first, while Port B refers to the port whose command is executed second. A rising edge 910 of FPGA clock 902 triggers the receipt of a command 904 received from Port A. Command 904 may be a read command or a write command. After command 904 has been received, a command 906 from Port B is received. Thus, in some embodiments, the execution of commands is based upon the rising edge 910 of clock 902, with the falling edge of the clock 902 playing no role. It is understood that while a read or write command may take several RAM clock cycles to execute, a new command can be received every RAM clock cycle.

In some embodiments, there may be time left during an FPGA clock cycle after the execution of command 906 (e.g., an FPGA clock cycle may be over twice as long as a RAM clock cycle). This extra amount of time may be used to implement additional user-defined combinational logic (e.g., additional logic 908a on Port A, and additional logic 908b on Port B). In some embodiments, the additional logic may comprise error correction code (ECC) operations. For example, additional logic 908b may be used to encode ECC information that is to be written on memory matrix 100, while additional logic 908a may be used to read and decode ECC information from memory matrix 100.

Thus for each FPGA clock cycle, two commands may be processed by the memory matrix 100. These commands may be read commands, write commands, or combination of both read and write commands. For example, in a given FPGA clock cycle, the memory matrix 100 may process one read command and one write command, two read commands, or two write commands.

Figure 10:
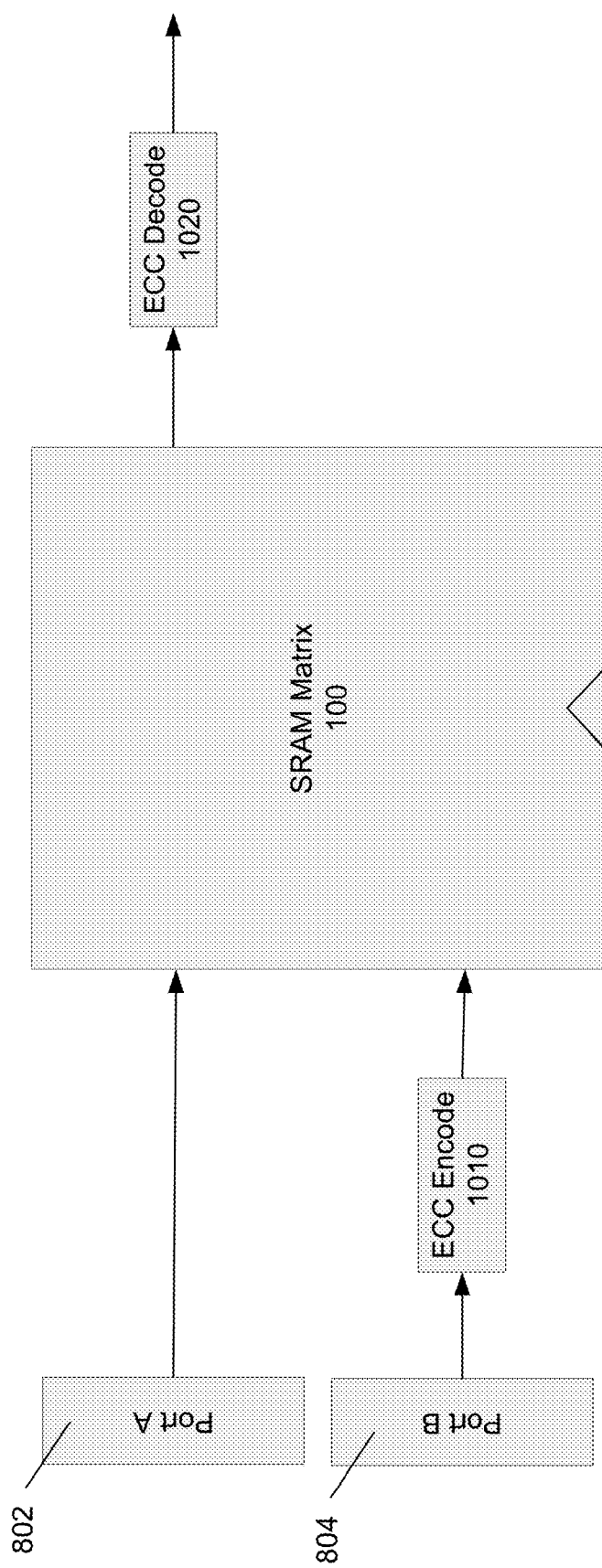
FIG. 10 illustrates a double-pumped memory matrix with ECC.

In some embodiments, in addition to processing read and write commands, the memory matrix 100 may generate ECC status information. In some embodiments, ECC information is encoded and written to the memory matrix 100, and then read and output to be decoded. FIG. 10 illustrates a double-pumped memory matrix 100 with ECC. Because the command from Port A is executed first (e.g., at the rising edge of the clock cycle), there is a period of time after the command of Port A has been executed to read and decode ECC information at ECC decoder 1020.

Because command from Port B is executed second (e.g., after the command from Port A has been executed), the period of time before the command from Port B is executed may be used to encode ECC information at the ECC encoder 1010 to be written to memory matrix 100. Thus in some embodiments, ECC encode and decode are able to be fit into an FPGA clock cycle, by performing ECC encode using Port B, and ECC decode using Port A. In some embodiments, ECC encoder 1010 and decoder 1020 are implemented as part of memory matrix 100, while in other embodiments they may be implemented as part of the FPGA fabric.

In the above examples, the various features have been described with reference to the memory matrix 100 on an FPGA. However, in other embodiments, the various features described herein may be provided for any integrated circuit, which may or may not be a FPGA. For example, in other embodiments, the various features (such as the cascade configurations for the memory matrix, the address decoder, the double-pump feature, etc.) described herein may be provided for other types of processors. Further, the exemplary memory matrices shown and described herein may be included in any integrated circuit, which may be programmable, non-programmable, or partially programmable.

Although particular examples have been shown and described, it will be understood that it is not intended to limit the claimed inventions to the illustrated examples, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An integrated circuit comprising a memory matrix, the memory matrix comprising:
   a first memory cell array;
   a first multiplexer (MUX) coupled to an input of the first memory cell array;
   a second MUX coupled to an output of the first memory cell array;
   a second memory cell array;
   a third MUX coupled to an input of the second memory cell array; and
   a fourth MUX coupled to an output of the second memory cell array;
   wherein the second MUX is coupled to the fourth MUX, the fourth MUX configured to pass a selected one of: (1) an output from the third MUX, (2) an output from the second memory cell array, or (3) an output from the second MUX.

2. The integrated circuit of claim 1, wherein the first memory cell array is a first one in terms of order in a cascade of memory cell arrays that include the first memory cell array and the second memory cell array.

3. The integrated circuit of claim 1, further comprising:
   an input bus and an output bus;
   wherein the input bus and the output bus are located on opposite sides of the memory matrix.

4. The integrated circuit of claim 3, wherein the input bus is configured to receive commands alternately from a first port and a second port via an input MUX.

5. The integrated circuit of claim 4, wherein:
   the first port is configured to pass a first command to the input MUX, and the second port is configured to pass a second command to the input MUX; and
   the first command is for execution on a rising edge of a clock signal, and the second command is for execution after the first command is executed.

6. The integrated circuit of claim 5, wherein:
   the first command is a read command; and
   the second command is a write command.

7. The integrated circuit of claim 1, wherein a read latency of a read command received by the memory matrix is substantially constant regardless of a position of a particular memory cell array specified by an address of the read command.

8. The integrated circuit of claim 1, wherein:
   the third MUX is user-configurable; and
   a configuration of the third MUX determines whether the third MUX receives data from an input bus of the memory matrix or from the second MUX.

9. The integrated circuit of claim 1, wherein the first memory cell array comprises a static random access memory (SRAM) array.

10. The integrated circuit of claim 1, wherein the integrated circuit is a part of a field programmable gate array (FPGA), and wherein a clock speed of the memory matrix is faster than a clock speed of the FPGA.

11. An integrated circuit comprising a memory matrix, the memory matrix comprising:
    a first memory cell array;
    a first multiplexer (MUX) coupled to an input of the first memory cell array;
    a second MUX coupled to an output of the first memory cell array;
    a second memory cell array;
    a third MUX coupled to an input of the second memory cell array; and
    a fourth MUX coupled to an output of the second memory cell array;
    wherein the first MUX is coupled to provide output to the third MUX; and
    wherein the second MUX is coupled to provide output to the fourth MUX.

12. The integrated circuit of claim 11, wherein the first memory cell array is a first one in terms of order in a cascade of memory cell arrays that include the first memory cell array and the second memory cell array.

13. The integrated circuit of claim 11, further comprising:
an input bus and an output bus;
wherein the input bus and the output bus are located on opposite sides of the memory matrix.

14. The integrated circuit of claim 13, wherein the input bus is configured to receive commands alternately from a first port and a second port via an input MUX.

15. The integrated circuit of claim 14, wherein:
the first port is configured to pass a first command to the input MUX, and the second port is configured to pass a second command to the input MUX; and
the first command is for execution on a rising edge of a clock signal, and the second command is for execution after the first command is executed.

16. The integrated circuit of claim 15, wherein the first command is a read command, and the second command is a write command.

17. The integrated circuit of claim 11, wherein a read latency of a read command received by the memory matrix is substantially constant regardless of a position of a particular memory cell array specified by an address of the read command.

18. The integrated circuit of claim 11, wherein:
the third MUX is user-configurable; and
a configuration of the third MUX determines whether the third MUX receives data from an input bus of the memory matrix or from the first MUX.

19. The integrated circuit of claim 11, wherein the first memory cell array comprises a static random access memory (SRAM) array.

20. The integrated circuit of claim 11, wherein:
the integrated circuit is a part of a field programmable gate array (FPGA); and
a clock speed of the memory matrix is faster than a clock speed of the FPGA.

* * * * *